United States Patent [19]
Amemiya et al.

[11] Patent Number: 5,903,161
[45] Date of Patent: May 11, 1999

[54] ELECTRICALLY CONDUCTIVE ROD-SHAPED SINGLE CRYSTAL PRODUCT AND ASSEMBLY FOR MEASURING ELECTRICAL PROPERTIES EMPLOYING SUCH PRODUCT, AS WELL AS PROCESSES FOR THEIR PRODUCTION

[75] Inventors: Masaru Amemiya; Kazuo Kato; Noriaki Nakazaki; Tatsuo Nakano, all of Machida, Japan

[73] Assignee: Denki Kagaku Kogyo Kabushiki Kaisha, Tokyo, Japan

[21] Appl. No.: 08/378,728

[22] Filed: Jan. 26, 1995

[51] Int. Cl.$^6$ .................................................. G01R 1/073
[52] U.S. Cl. ........................................... 324/754; 324/761
[58] Field of Search .................... 324/754, 758, 324/755, 72.5, 761

[56] References Cited

U.S. PATENT DOCUMENTS

| | | | |
|---|---|---|---|
| 4,585,991 | 4/1986 | Reid et al. | 324/754 |
| 4,754,316 | 6/1988 | Reid | 324/754 |
| 5,055,780 | 10/1991 | Takagi et al. | 324/754 |
| 5,072,116 | 12/1991 | Kawade et al. | 324/754 |
| 5,326,428 | 7/1994 | Farnworht et al. | 324/500 |

FOREIGN PATENT DOCUMENTS

| | | |
|---|---|---|
| 2-176405 | 7/1990 | Japan . |
| 5-198636 | 8/1993 | Japan . |
| 5-215774 | 8/1993 | Japan . |
| 5-218156 | 8/1993 | Japan . |

*Primary Examiner*—Ernest F. Karlsen
*Attorney, Agent, or Firm*—Oblon, Spivak, McClelland, Maier & Neustadt, P.C.

[57] ABSTRACT

An electrically conductive rod-shaped single crystal product, which is a rod-shaped single crystal having an aspect ratio of from 1 to 500, formed by a vapor-liquid-solid method or such a rod-shaped single crystal having its forward end alloy portion removed, wherein at least side surface of said rod-shaped single crystal is coated by an electrically conductive film having a thickness of from 0.1 to 10 μm.

18 Claims, 11 Drawing Sheets

ELECTRICALLY CONDUCTIVE ROD-SHAPED SINGLE CRYSTAL PRODUCT AND ASSEMBLY FOR MEASURING ELECTRICAL PROPERTIES EMPLOYING SUCH PRODUCT, AS WELL AS PROCESSES FOR THEIR PRODUCTION

BACKGROUND OF THE INVENTION

1. Field of the Invention

The present invention relates to an electrically conductive rod-shaped single crystal product which is useful for e.g. a probe pin for measuring electrical properties of a semiconductor integrated circuit, a fine vacuum device or an electron gun, or a probe for a scanning type probe microscope such as a scanning tunnel microscope or an inter-atomic force microscope, and an assembly for measuring electrical properties employing such a single crystal product.

2. Discussion of Background

Heretofore, various materials having electrical conductivity or electron radiation have been used for a probe pin for measuring electrical properties of a semiconductor integrated circuit, a fine vacuum device or a electron gun, or a probe for a scanning type probe microscope such as a scanning tunnel microscope or an inter-atomic force microscope. For example, the probe pin for measuring electrical properties of a semiconductor integrated circuit, is used for a probe card for measuring electrical properties to remove defective products in the process for producing a semiconductor integrated circuit. Hereinafter, a specific description will be made with respect to the probe pin for measuring electrical properties of a semiconductor integrated circuit. In the production of LSI, measurement is carried out to test the operation of a circuit element constituting each chip, at a stage when a circuit element is produced in a wafer. Thereafter, when a chip cut off from the wafer, has been packaged or mounted on a TAB tape, measurement is carried out again for testing the operation. For the former test, it is common to employ a probe card having a probe pin made of a metal such as tungsten. The latter test is carried out by using a socket, to which an outer lead is inserted, in many cases. However, in the case of TAB, a probe card may sometimes be used. In such a probe card, a probe pin made of tungsten is used in most cases, and its forward end is bent so that it will be resiliently in contact with an electrode of a semiconductor to be evaluated. In a probe card, it is common that a plurality of probe pins will be brought into contact with electrodes of a semiconductor to be evaluated. Accordingly, it is necessary to absorb errors in e.g. the flatness of the forward ends of the probe pins, the flatness of the electrodes of the semiconductor to be evaluated and their parallelism when they are set in an evaluation apparatus. For this purposes in the case of tungsten wires, probe pins are designed to bend. The degree of bending of the probe pins is referred to as overdrive. A probe card using a tungsten wire is designed so that this overdrive can be exerted up to 100 $\mu$m. Current probe cards are prepared so that such probe pins are positioned and fixed individually so that they agree to the positions of the electrodes of a semiconductor to be evaluated. However, with a rapid progress in refinement of semiconductors, it has become difficult to fix probe pins accurately and highly densely, and preparation of probe cards has reached the limit.

Under the circumstances, a probe card has been devised wherein fine probe pins are planted on a substrate vertically or with a proper angle of inclination. For example, methods have been proposed in which single crystals are formed on a silicon substrate with their positions controlled by a vapor-liquid-solid methods and they are used as probe pins for a probe card (Japanese Unexamined Patent Publications No. 198636/1993, No. 215774/1993 and No. 218156/1993). In these methods, single crystal pins are grown on a silicon substrate with their positions controlled, and they are further processed e.g. by plating to have electrical conductivity, and such a substrate using the electrically conductive rod-shaped single crystal products as probe pins, has been used for a probe card (hereinafter the electrically conductive rod-shaped single crystal product of the present invention includes a probe pin for a probe card, and an assembly for measuring electrical properties using such a probe pin includes a probe card, but they may be called a probe pin and a probe card, respectively).

However, conventional probe pins prepared by a vapor-liquid-solid method had the following problems.

① The ratio of the forward end diameter of a probe pin to the length of the pin is called an aspect ratio. If this aspect ratio is small, overdrive can not be applied to probe pins, and in measurement by means of a plurality of probe pins, it is difficult to let all of the probe pins contact the electrodes of a semiconductor for evaluation. Further, flexible deformation within a resilient range of probe pins by overdrive can not be expected, and probe pins are likely to break. When the aspect ratio is too large, operation efficiency tends to be poor in the preparation and use, and probe pins tend to break. Further, probe pins tend to buckle and contact each other, and the load when contacted tends to be so small that a constant electrical conductivity can not be obtained.

② If the diameter of probe pins is too small, the probe pins are likely to break. On the other hand, if it is too large, they can not meet the requirement for high density of semiconductor terminals.

③ If the material of the conductive film is not proper, the conductive films at the forward ends of probe pins tend to peel off by repeated contact of some ten thousand times, and the life of the probe pins tends to be short.

④ If the film thickness of the conductive plating is too thin, the electrical resistance of the probe pins tends to be high. On the other hand, if it is too thick, the resiliency of the probe pins tends to be impaired, whereby the probe pins are likely to deform ⑤ Further, the single crystal grown on a substrate by a vapor-liquid-solid method is made to be electrically conductive and can be used by itself as a probe pin for a probe card. However, when larger overdrive is required, the probe pin is likely to break at its base portion, and it will be necessary to reinforce the base portion.

⑥ When probe pins are to be bonded on a circuit board, such bonding is difficult, and an easier simpler method is desired.

⑦ If the inclination of a probe pin to a semiconductor terminal is not proper, when contacted, the probe pin slips on the terminal and may be dislocated.

⑧ When many probe pins are formed with a narrow pitch from one another, it is difficult to lead-out wires from the probe pins, because with a currently available technique of photolithography employing an insulating substrate using glass, epoxy or the like, it is very difficult to conduct processing including wiring of an insulating substrate with such a fine pitch as is equivalent to LSI produced by a semiconductor technique, and even if such a processing is possible it will be highly costly.

SUMMARY OF THE INVENTION

The present invention has been made in view of the above-mentioned conventional problems, and it is an object of the present invention to provide an electrically conductive rod-shaped single crystal product which is not easily broken, which can be contacted with a test sample with good positional precision and which can be contacted to the test sample with adequate continuity or electrical conduction.

Further, it is another object of the present invention to provide such electrically conductive rod-shaped single crystal products formed in a high density at desired positions with high precision.

A further object of the present invention is to present an assembly for measuring electrical properties employing such electrically conductive rod-shaped single crystal products.

A still further object of the present invention is to provide processes for readily producing such a single crystal product and an assembly.

The present inventors have conducted extensive studies on methods and conditions including the aspect ratio (the ratio of length/diameter of the forward end) of the electrically conductive rod-shaped single crystal products the thickness of the conductive film and the method for reinforced fixing of electrically conductive rod-shaped single crystal products in order to obtain the above-mentioned electrically conductive rod-shaped single crystal product and the assembly for measuring electrical properties using such single crystal products. As a results they have found it possible to readily obtain an electrically conductive rod-shaped single crystal product of the present invention which has excellent properties which have not been attained heretofore and have succeeded in accomplishing an assembly for measuring electrical properties useful for measuring electrical properties, for e.g. probe cards, by employing such single crystal products, and processes for their production.

The present invention provides an electrically conductive rod-shaped single crystal products which is a rod-shaped single crystal having an aspect ratio of from 1 to 500, formed by a vapor-liquid-solid method or such a rod-shaped single crystal having its forward end alloy portion removed, wherein at least side surface of said rod-shaped single crystal is coated by an electrically conductive film having a thickness of from 0.1 to 10 $\mu$m, and an assembly for measuring electrical properties employing such an electrically conductive rod-shaped single crystal product, The diameter of the electrically conductive rod-shaped single crystal product is preferably from 1 to 600 $\mu$m, more preferably from 5 to 300 $\mu$m.

The thickness of the conductive film of the electrically conductive rod-shaped single crystal product is preferably from 0.1 to 10 $\mu$m. More preferably, the diameter d of the rod-shaped single crystal of the electrically conductive rod-shaped single crystal product is from 1 to 50 $\mu$m, and the thickness of the conductive film is at most d×0.4 $\mu$m and at least 0.1 $\mu$m. Further, it is preferred that at least the surface of the conductive film is Pd.

Further, it is preferred that the surface of the electrically conductive rod-shaped single crystal product is coated by an insulating film having a thickness of from 0.1 to 10 $\mu$m except for at least the forward end portion of the single crystal product.

Further, it is preferred that the electrically conductive rod-shaped single crystal product is integral with the substrate on which the rod-shaped single crystal is formed and it projects with a length of from 10 to 3,000 $\mu$m from the surface of the substrate. Further, it is preferred that the electrically conductive rod-shaped single crystal product is embedded in an insulating material at a desired position, and one end of the electrically conductive rod-shaped single crystal product projects with a length of from 10 to 3,000 $\mu$m from the surface of the insulating material It is preferred that the limiting overdrive of such electrically conductive rod-shaped single crystal products is at most 1,000 $\mu$m. Further, it is preferred that such electrically conductive rod-shaped single crystal products are fixed at an angle of from 80° to 90° to the substrate surface or the surface of the insulating material.

Further, the distance L ($\mu$m) between the free end of the electrically conductive rod-shaped single crystal product and the substrate surface or the surface of the insulating material on which the electrically conductive rod-shaped single crystal product is fixed, and the diameter d ($\mu$m) of the rod-shaped single crystal constituting the electrically conductive rod-shaped single crystal product, are within a range of $d^{-2.4} \cdot L^{2.8} \geq 5.0 \times 10^4$.

Furthermore, it is preferred that the embedding thickness of the insulating material is from 0.1 to 2,000 $\mu$m and the insulating material is an epoxy resin or glass having a thermal expansion coefficient (1/°C.) of from $3.0 \times 10^{-6}$ to $8.0 \times 10^{-6}$ at from 30 to 250° C.

The process of the present invention is a process for producing an assembly for measuring electrical properties, which comprises disposing a dam plate on a substrate on which an electrically conductive rod-shaped single crystal product is present, so that the base of said electrically conductive rod-shaped single crystal product and the substrate surface at its periphery are exposed, covering the exposed base of the electrically conductive rod-shaped single crystal product and the exposed substrate surface at the periphery of the base, by a fixing material and curing the fixing material to fix the electrically conductive rod-shaped single crystal product.

When glass is used as the insulating material, a low melting point glass having a thermal expansion coefficient (1/°C.) of from $3.0 \times 10^{-6}$ to $8.0 \times 10^{-6}$ at from 30 to 250° C. is disposed on a substrate on which an electrically conductive rod-shaped single crystal product is present, then heated and melted, followed by cooling.

The assembly for measuring electrical properties according to the present invention is preferably the one in which the end close to the insulating material, of the electrically conductive rod-shaped single crystal product embedded in the insulating material is connected to the wiring of a circuit board. One of processes for producing an assembly for measuring electrical properties prepared by connecting the end of the electrically conductive rod-shaped single crystal product to the wiring of the circuit board, comprises the following steps (1) to (4):

(1) A step of coating an epoxy composition containing an acid anhydride as a curing agent, on a substrate on which an electrically conductive single crystal product is present and curing the composition to form a cured product;

(2) A step of removing the substrate in its entirety;

(3) A step of treating the cured product with an aqueous alkaline solution to expose both ends of the electrically conductive single crystal product; and (4) A step of connecting an exposed end surface of the electrically conductive single crystal product to a wiring of a circuit board.

Otherwise, the assembly for measuring electrical properties can be prepared by a process comprising the following steps (5) to (9).

(5) A step of forming a polymer compound film of from 10 to 100 $\mu$m on a substrate on which an electrically conductive single crystal product is present;

(6) A step of coating an acid anhydride-curable epoxy composition on the polymer compound film formed in step (5) so that the electrically conductive single crystal product projects, and then curing the epoxy composition to form a cured product;

(7) A step of removing the substrate in its entirety;

(8) A step of removing the polymer compound to expose an end of the electrically conductive single crystal product; and (9) A step of connecting the exposed end of the electrically conductive single crystal product to a wiring of a lead-out circuit board.

Further, the present invention provides an assembly for measuring electrical properties, which comprises an electrically conductive rod-shaped single crystal product consisting essentially of a rod-shaped single crystal having an aspect ratio of from 1 to 500, formed by a vapor-liquid-solid method or such a rod-shaped single crystal with its forward end alloy portion removed, at least side surface of said single crystal being coated with an electrically conductive film having a thickness of from 0.1 to 10 μm, and a semiconductor chip having a lead-out wiring.

DETAILED DESCRIPTION OF THE PREFERRED EMBODIMENTS

Now, the present invention will be described in detail.

Figure 1A:
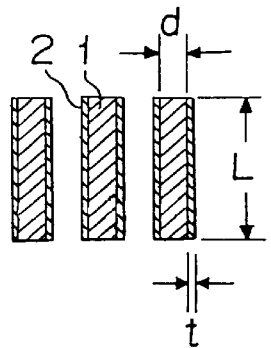
FIGS. 1a–1f are views illustrating one embodiment of the electrically conductive rod-shaped single crystal product of the present invention.
Figure 1B:
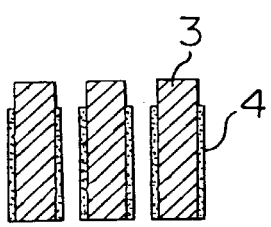
Figure 1C:
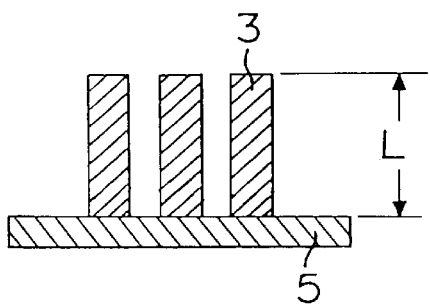
Figure 1D:
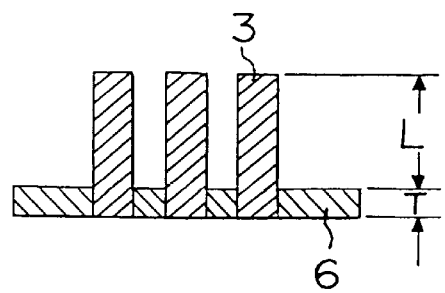

The electrically conductive rod-shaped single crystal product to be used in the present invention is preferably the one in which, as shown in FIG. 1(a) at least side surface of a rod-shaped single crystal 1 having an aspect ratio (a ratio of the length L of the rod-shaped single crystal to the diameter d of the forward end thereof) of from 1 to 500, formed by a vapor-liquid-solid method or such a rod-shaped single crystal 1 having its forward end alloy portion removed, is coated by an electrically conductive film 2 having a thickness of from 0.1 to 10 μm. Further, in order to avoid electrical contact of adjacent electrically conductive rod-shaped single crystal products to each other, the electrically conductive rod-shaped single crystal products 3 may have a structure such that they are coated with an insulating film 4 having a thickness of from 0.1 to 10 μm except for their forward end portions, as shown in FIG. 1(b). Further as shown in FIG. 1(c), the electrically conductive rod-shaped single crystal products 3 may be used together with a substrate 5 on which rod-shaped single crystals are formed, or they may be used in a state wherein such a substrate has been removed (FIG. 1(a)). In a case where they are used with the substrate removed, it is preferred that as shown in FIG. 1(d), the electrically conductive rod-shaped single crystal products 3 are embedded in an insulating material 6 at desired positions.

The VLS (vapor-liquid-solid) method used as a method for forming rod-shaped single crystals, is disclosed by R. S. Wagner and W. C. Ellis; Appln. Phys. Letters 4 (1964) 89. The method disclosed in this reference comprises heating a Si single crystal substrate having Au particles mounted thereon in a Si containing gas atmosphere such as $SiH_4$ or $SiCl_4$ at a temperature higher than the melting point of a Si-Au alloy to let rod-shaped Si single crystals epitaxially grow on the Si single crystal substrate at the positions where Au particles are mounted.

This method is applied not only to the growth of a Si single crystal but also to the growth of other single crystals. For examples a $LaB_6$ single crystal is not necessarily suitable for molten-liquid growths since the melting point is as high as 2,530° C., the evaporation rate is highs and the reactivity is high. Accordingly, the VLS method whereby crystal growth at a lower temperature is possible, has been tried (Journal of Crystal Growth 51 (1981) 190–194).

Instead of placing Au particles if Au pads are formed at optional positions on a Si substrate by a proper combination of a photolithography method, a plating method, a vapor deposition method and an etching method, followed by the VLS method, it is possible to form a plurality of rod-shaped single crystals standing at the optional positions on the substrate, and they may be used as probe pins for measuring electrical properties.

The material constituting the rod-shaped single crystals of the present invention may, for example, be Si, $LaB_6$, GaAs, GaP, $WO_2$ or SiC, particularly preferably Si or $LaB_6$. Such an element or compounds may form an alloy with Au, Pt, Ag, Cu, Pd or Ga, particularly preferably Au or Pt.

The shape of the rod-shaped single crystal to be used in the present invention is preferably cylindrical or a shape close thereto when the buckling load, the flexibility etc. at the time of measuring electrical properties are taken into consideration, and its diameter d is preferably within a range of from 1 to 600 μm, more preferably from 5 to 300 μm, at the forward end of the rod-shaped single crystal. The length L of the rod-shaped single crystal is preferably at least 10 μm, more preferably from 200 μm to 5 mm. If the length exceeds 5 mm, many kinks or branches tend to form at the time of forming the rod-shaped single crystal by the VLS method. The aspect ratio of the rod-shaped single crystal is preferably from 1 to 500. If the aspect ratio is less than 1, the rod-shaped single crystal is too short to be useful as a probe pin for measuring electrical properties. On the other hand, if it exceeds 500, the working efficiency for its preparation or for its use tends to be poor, and the probe pin tends to easily break, and the buckling load tends to be low, whereby constant conductivity tends to be hardly obtained. It is further preferred to select an aspect ratio such that the distance L ($\mu$m) between the free end of the electrically conductive rod-shaped single crystal product and the substrate surface or the surface of an insulating material on which the electrically conductive rod-shaped single crystal product is fixed, and the diameter d ($\mu$m) of the rod-shaped single crystal, are within a range of $d^{-2.4} \cdot L^{2.8} \geq 5.0 \times 10^4$, whereby a proper limiting overdrive can be obtained.

Rod-shaped single crystals formed by the VLS method necessarily have forward end alloy portions. The forward end alloy portions are relatively easily crushed when they are used for an assembly for measuring electrical properties such as a probe card for measuring electrical properties of a semiconductor integrated circuit. To reduce deformation of the forward ends, it is preferred to remove the forward end alloy portions. Further, in order to improve the lengthwise precision of a plurality of electrically conductive rod-shaped single crystal products, the rod-shaped single crystals in the vicinity of the forward end alloy portions may simultaneously be removed at the time of removing the forward end alloy portions. The removal of the forward end alloy portions may be conducted at any optional stage in the process. For example, they may be removed (1) after forming the rod-shaped single crystals by the VLS method, (2) after forming a conductive film thereon, or (3) after covering them with an insulating material. Further, at the time of removing the forward end alloy portions at the optional step, part of the rod-shaped single crystals may simultaneously be removed as mentioned above.

The removal of the forward end alloy portions, can be conducted by various methods, and it is particularly preferred to remove them by a polishing method. The polishing method may specifically be polishing treatment by means of an abrasive pad or abrasive grains. As the abrasive pad, it is common to employ a pad on which abrasive grains of e.g. aluminum oxide, silicon carbide or chromium oxide are deposited. Further, at the time of polishing, it is preferred to cover the rod-shaped single crystals with a wax for polishing in order to prevent breakage of the rod-shaped single crystals.

As the substrate for VLS crystal growth, it is possible to employ a single crystal substrate made of the same material as single crystals to be grown, or a substrate having a single crystal film of the same material as the single crystals to be grown, formed on an insulating substrate. For examples a single crystal silicon substrates or a substrate (SOI substrate) having single crystal Si formed on an oxidized surface of a single crystal silicon substrates may be used. Further, a substrate having a single crystal film formed on an insulating material such as sapphire, may also be used. In a case where rod-shaped crystals are to be grown on a SOI substrate in the present invention, a SOI technique is used. As the SOI technique to be used in the present inventions it is possible to employ a method wherein oxygen ions are impinged to a single crystal Si substrate to form oxidized regions immediately underneath the regions for single crystals (SIMOX; Porc. ISIAT '83, 1983, p. 1855), or a method wherein a single crystal Si substrate is laminated by heat treatment on an oxidized surface of an surface-oxidized single crystal Si supporting substrate (Digest of the IEEE Int., Elec. Devices Meeting (IEDM) 1985, p 684).

The electrically conductive rod-shaped single crystal product is such that at least side surface of a rod-shaped single crystal formed by a VLS method is coated by an electrically conductive film having a thickness of from 0.1 to 10 $\mu$m. If the thickness of the conductive film is less than 0.1 $\mu$m, the conductive film tends to be susceptible to rupture or peeling by abrasion. On the other hand, if it exceeds 10 $\mu$m, it tends to be difficult to form a uniform films and the cost tends to be high. Especially when the diameter d of the forward end of the rod-shaped single crystal is from 1 to 50 $\mu$m, the thickness of the conductive film is more preferably at most d×0.4 $\mu$m.

To form such a conductive film, a vapor deposition method, a plating method or a dipping method may, for example, be employed to cover the surface of the rod-shaped single crystal. Specifically, a method may be mentioned wherein a primer layer of Ni-P or Cr is formed on the rod-shaped single crystal by a plating method or a vapor deposition method, and then highly conductive metal such as Au, Au-Ni, Au-Co, Au-Cr, Au-Cu or Rh is coated by a plating method. When Pd is used as the material for the surface layer of this conductive film, it is easy to form a plating film on the forward end portion of a probe pin, and the plated film tends to be scarcely peeled, and the abrasion resistance will be good. Such a conductive film covers at least side surface of the rod-shaped single crystal, but it is more preferred that also the forward end portion of the rod-shaped single crystal is coated by the conductive film.

If a lead-out wire is formed on the substrate on which the rod-shaped single crystal is grown, the electrically conductive rod-shaped single crystal product can be used as it is in the form integral with the substrates as an assembly for measuring electrical properties. It is thereby possible not only to simplify the production of an assembly for measuring electrical properties, but also to make the production of an assembly for measuring electrical properties wherein a plurality of electrically conductive rod-shaped single crystal products are arranged with good precision, possible. Further, according to this method, in a case where the assembly is used for a test wherein a thermal load is exerted, such as a bar-in-test of a semiconductor integrated circuits it is possible to substantially overcome the positional displacement of the probe pin from the terminal of the test sample due to the difference in the thermal expansion coefficient, by selecting the substrate material for the VLS method to be the same as the substrate material of the test sample.

When the electrically conductive rod-shaped single crystal products are used in a form not integral with the substrate, they may be used in a reinforced state (FIG. 1(d)) by covering or embedding the base portions of electrically conductive single crystal products with an insulating material.

In the present invention, as the insulating material to cover or embed the electrically conductive rod-shaped single crystal products, a resin, glass or ceramics may, for example, be used. The resin may be a thermosetting resin or a thermoplastic resin. The thermosetting resin may, for example, be an epoxy resin, an acrylic resin, a silicone resin, a urethane resin or a polyimide resin, and the thermoplastic resin may, for example, be an olefinic resin or a styrene resin. Particularly preferred is an epoxy resin. An inorganic filler may be incorporated to such a resin. The inorganic filler may, for example, be $SiO_2$ or $Al_2O_3$.

The thickness of the insulating material is preferably from 0.1 to 2,000 $\mu$m. If the thickness of the covering portion is too thin, the strength will be inadequate, and if it is too thick, the positional precision of the forward ends of the electrically conductive rod-shaped single crystal products tends to be poor, and the length of the single crystal products tends to be too long, whereby the production tends to be difficult.

The glass to be used in the present invention is a low melting point glass containing e.g. PbO, $B_2O_3$ or ZnO, and it is preferably the one having a softening point of from 300 to 500° C., which is suitable for bonding a metal, ceramics or glass and which is used for e.g. sealing of an electron tube. The thermal expansion coefficient of the glass is preferably as close as possible to the thermal expansion coefficient of Si. Preferred is a low melting point glass having a thermal expansion coefficient (1/°C.) of from $3.0\times10^{-6}$ to $8.0\times10^{-6}$ at from 30 to 250° C., as measured by a Dilatometer. The lower the softening point of glass, the better. With a view to preventing peeling from the Si substrate due to the difference in the thermal expansion or peeling of the conductive film plated on the rod-shaped single crystals, a low melting point glass having a softening point of from 300 to 500° C., is more preferred.

With respect to embedding with an insulating material such as a resin or a low melting point glass, the thickness (t in FIG. 1(d)) is not particularly limited. However, a thickness of from 5 to 2 mm is preferred, since preparation is thereby easy, and proper fixing strength can be obtained. The forward ends of the electrically conductive rod-shaped single crystal products embedded in the insulating material, which are to be contacted with the test sample, project with a length of from 10 to 3,000 μm from the surface of the insulating material. If the length is less than 10 μm, the electrically conductive rod-shaped single crystal products will be susceptible to breakage, and if the length is more than 3,000 μm, the overdrive tends to be excessive, and the efficiency in their preparation or use tends to be poor, such being undesirable.

Figure 1E:
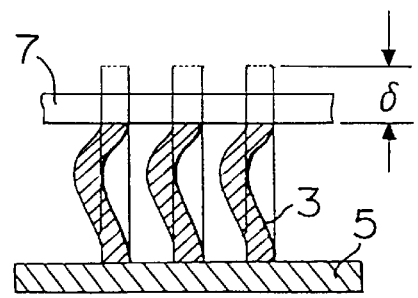
Figure 1F:
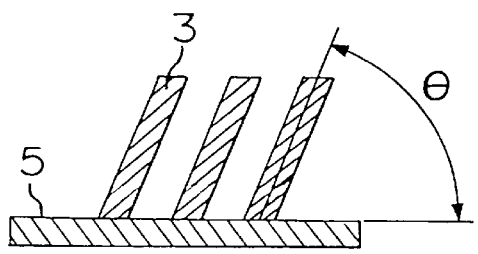

FIG. 1(e) illustrates a state wherein the ends of the electrically conductive rod-shaped single crystal products of the present invention are press-contacted to a test sample, whereby the electrically conductive rod-shaped single crystal products deform depending upon the load in the press-contacting direction. This deformation δ is referred to as overdrive. As the load increases, the load and the deformation will proportionally change at the initial stage, but the load will sooner become constant and finally leads to breakage. The overdrive at that time is referred to as the limiting overdrive ($\delta_{max}$), and the load at that time is referred to as a buckling load. Furthers as shown in FIG. 1(f), the electrically conductive rod-shaped single crystal products are preferably fixed at an angle of from 80° to 90° to the substrate surface or the surface of the insulating material (here, the substrate 5 is shown), whereby the electrically conductive rod-shaped single crystal products will contact the surface of a semiconductor integrated circuit to be tested, at an angle of from 80° to 90°. For example, when the electrically conductive rod-shaped single crystal products of the present invention are to be used as probe pins of a probe card, the life of probe pins will be prolonged. Further, the positional precision of probe pins will be good, and they are particularly effective for an assembly for measuring electrical properties, for a high density fine probe card. Further, when they are inclined with an angle of at least 80° and less than 90°, the bending direction will be the same, whereby even if the bending degree is large, there will be no contact of probe pins to one another, whereby the continuity or electrical conductivity will be ensured.

Figure 2:
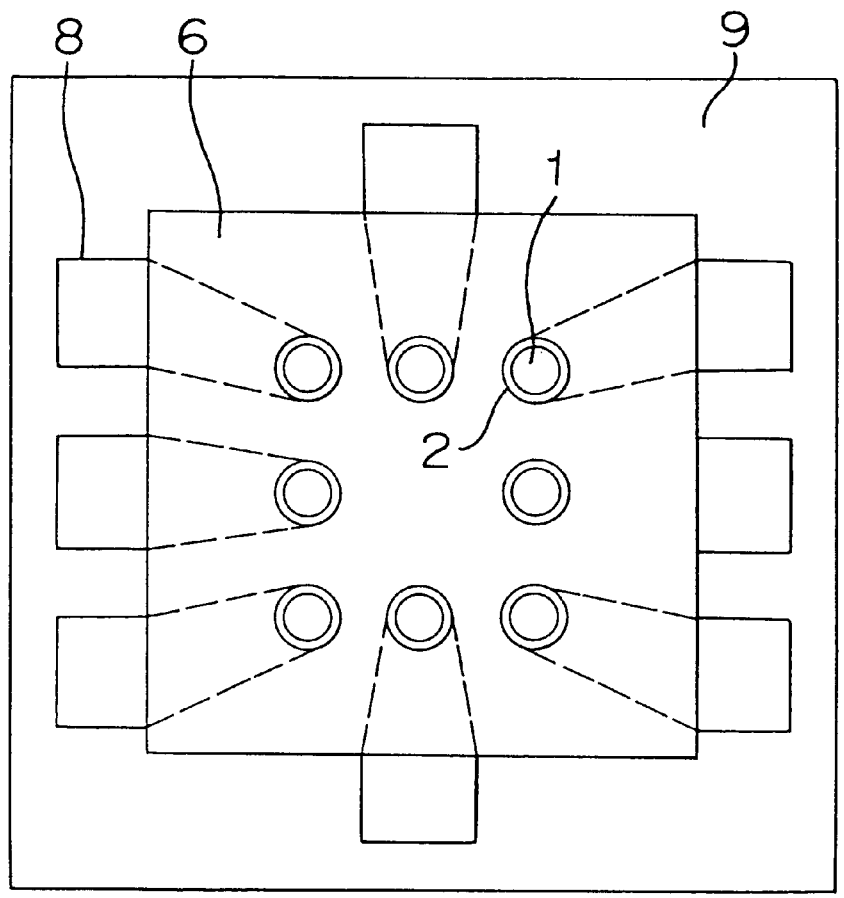
FIGS. 2a–2b are views illustrating an embodiment of the assembly for measuring electrical properties of the present invention.
Figure 2:
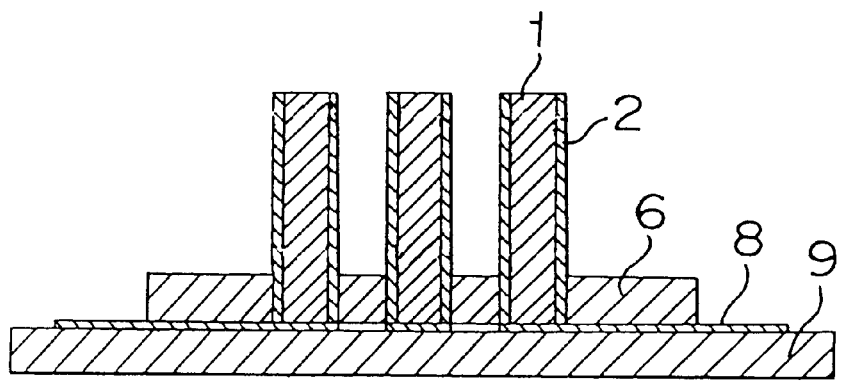
Figure 3:
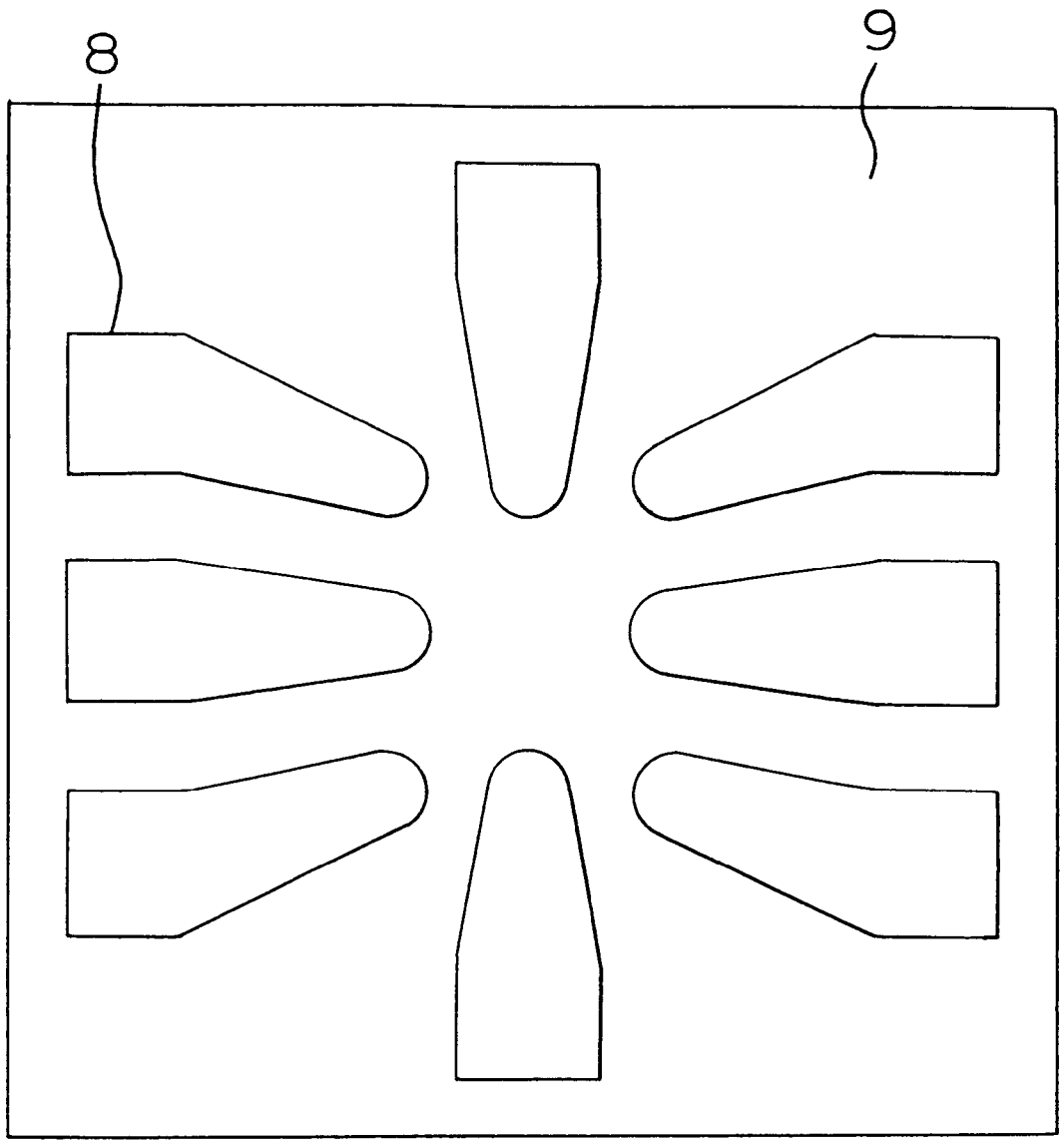
FIG. 3 is a view illustrating one example of a circuit board to be used in the present invention.

In a case where electrically conductive single crystal products fixed by the insulating material, obtained by removing the substrate after embedding in the insulating material, the base portions of the electrically conductive single crystal products formed on the substrate, are to be used as an assembly for measuring electrical properties, it is preferred to use them as bonded to a circuit board 9 for lead out, as shown in FIG. 2. FIG. 2(a) shows a diagrammatical view of an assembly for measuring electrical properties, prepared by connecting the ends of the electrically conductive rod-shaped single crystal products to wirings 8 of the circuit board, and FIG. 2(b) shows the cross sectional view thereof. FIG. 3 is a diagrammatic view of the circuit board.

Now, the process for producing an assembly for measuring electrical properties employing electrically conductive single crystal products of the present inventions will be described.

Figure 4:
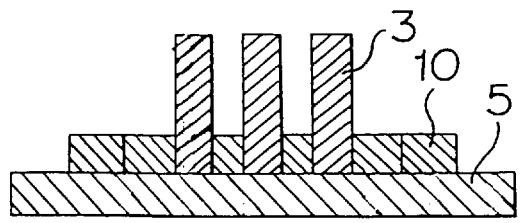
FIGS. 4a–4d are views illustrating an embodiment of the process for producing the assembly for measuring electrical properties of the present invention.
Figure 4:
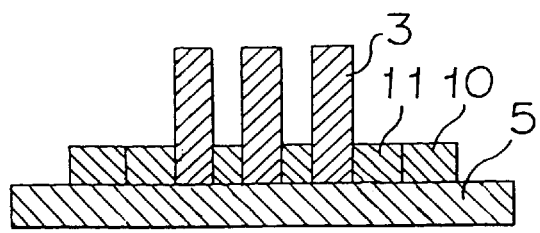
Figure 4:
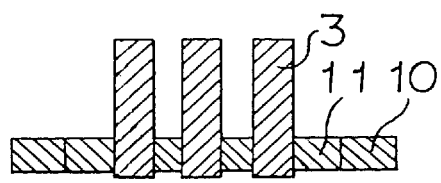
Figure 4:
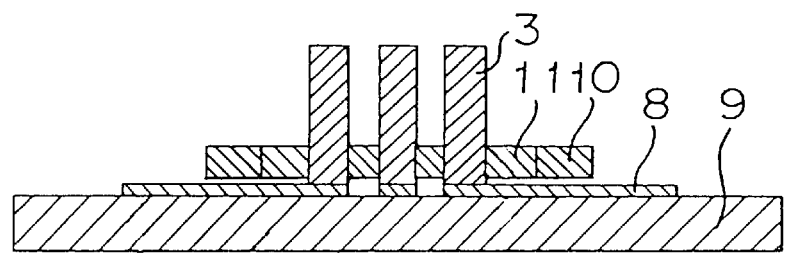

Firstly, the process in a case where electrically conductive rod-shaped single crystal products are embedded with a resin as an insulating material, will be described with reference to FIG. 4.

On a substrate 5 on which electrically conductive rod-shaped single crystal products 3 are present, a dam plate 10 is disposed so that the base portions of the electrically conductive rod-shaped single crystal products and their periphery are exposed (FIG. 4(a)). Then, the base portions of the electrically conductive rod-shaped single crystal products and the exposed portions of the substrate surface around the base portions are covered by a fixing material 11, and the fixing material 11 is cured to fix the electrically conductive rod-shaped single crystal products (FIG. 4(b)). The single crystal products may be used in that state as being integral with the substrates as an assembly for measuring electrical properties, by forming lead-out wires on the substrate. Otherwise, the substrate may be removed (FIG. 4(c)), and then the single crystal products may be connected to a separately prepared circuit board 9 (FIG. (d)).

At that time, the wirings of the circuit board are preferably directly connected to the end surfaces, or after applying gold bumps thereto, on the circuit board side of the insulating material having the electrically conductive rod-shaped single crystal products obtained by the above step embedded therein. Otherwise, the insulating material is subjected to etching so that the end portions of the electrically conductive rod-shaped single crystal products will project to some extent, and then the wirings of the circuit board are directly connected to the end surfaces of the electrically conductive rod-shaped single crystal products, or after applying gold bumps thereto, to obtain an assembly for measuring electrical properties, as shown in FIG. 4(d).

Here, the reason why the dam plate is used for fixing with a fixing material is such that if it is attempted to fix only with the fixing material without using the dam plate, there will be problems such that depending upon the viscosity of the fixing material, it will not be sufficiently filled between the probe pins, or it tends to creep up to the forward ends of the probe pins or tends to flow out. As the material of this dam plate, any material may be employed so long as it is chemically stable and has a high reinforcing effect. For example, a heat resistant resin such as an epoxy resin, a polyimide resin or polyphenylene oxide (PPO) or an insulating material such as glass or ceramics, can be used.

An embodiment of another process for producing an assembly for measuring electrical properties employing electrically conductive rod-shaped single crystal products will be described below with reference to FIG. 5.

This process comprises the following steps (1) to (4):

(1) A step of coating an epoxy composition containing an acid anhydride as a curing agent, on a substrate 5 on which electrically conductive rod-shaped single crystal products 3 are present, and curing the epoxy composition to form a cured product 12 (FIG. 5(a));

(2) A step of removing the substrate 5 in its entirety (FIG. 5(b));

(3) A step of treating the cured product 12 with an aqueous alkaline solution to expose both ends of the electrically conductive rod-shaped single crystal products (FIG. (c));

(4) A step of connecting the ends of the electrically conductive rod-shaped single crystal products exposed by (3) to the wirings 8 of a lead-out circuit board 9 (FIG. 5(d)).

In Step (3), both ends of the electrically conductive rod-shaped single crystal products are exposed. However, in a case where the side which is in contact with a test sample is fixed by a cured product of a resin as projected beforehand, the cured product may be treated with an aqueous alkaline solution to expose the ends on the side for contacting with the circuit boards so that both ends will be exposed.

Figure 6:
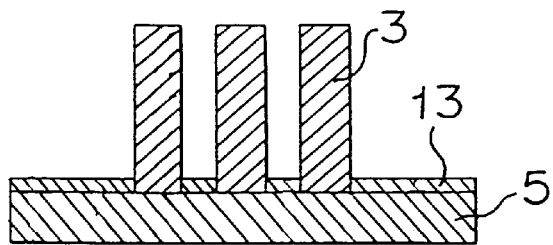
FIGS. 6a–6d are views illustrating a further embodiment of the process for producing the assembly for measuring electrical properties of the present invention.
Figure 6:
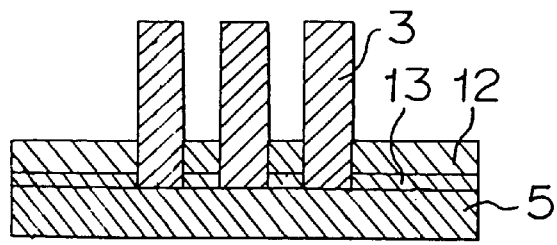
Figure 6:
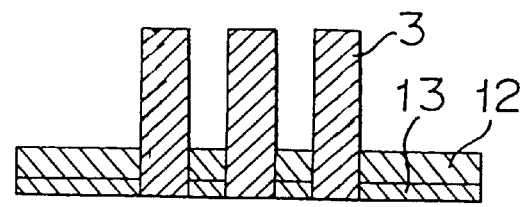
Figure 6:
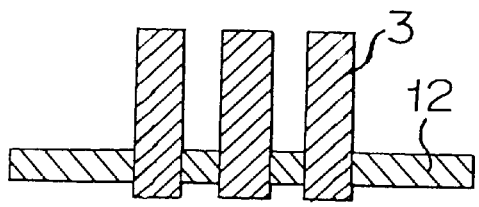

Further, as shown in FIG. 6, the assembly may be produced by a process comprising the following steps (5) to (9):

(5) A step of forming a polymer compound film 13 having a thickness of from 10 to 100 μm on a substrate 5 on which an electrically conductive rod-shaped single crystal products 3 are present (FIG. 6(a));

(6) A step of coating an acid anhydride-curable epoxy composition on a polymer compound film 13 formed by step (5), so that the electrically conductive rod-shaped single crystal products will projects and curing the epoxy composition to form a cured product 12 (FIG. 6(b));

(7) A step of removing the substrate in its entirety (FIG. 6(c));

(8) A step of removing the polymer compound film 13 to expose the ends of the electrically conductive rod-shaped single crystal products (FIG. 6(d)); and (9) A step of connecting the ends of the electrically conductive rod-shaped single crystal products exposed by (7) to the wirings 8 of a lead-out circuit board 9 (FIG. 6(e)).

By letting the ends of the electrically conductive rod-shaped single crystal products embedded in the insulating material on the side contacting with the circuit board project from the surface of the cured product of the resin by these methods, it is intended to ensure the contact with the wirings of the circuit board. The length of such projection is preferably from 10 to 100 μm. If the projection is less than 10 μm, connection with the wirings of the circuit board tends to be difficult, and if it exceeds 100 μm, the positional displacement tends to result. In either case, failure in the continuity or electrical conduction between the electrically conductive rod-shaped single crystal products and the circuit board tends to occur, and the yield in the production tends to be poor.

Figure 7:
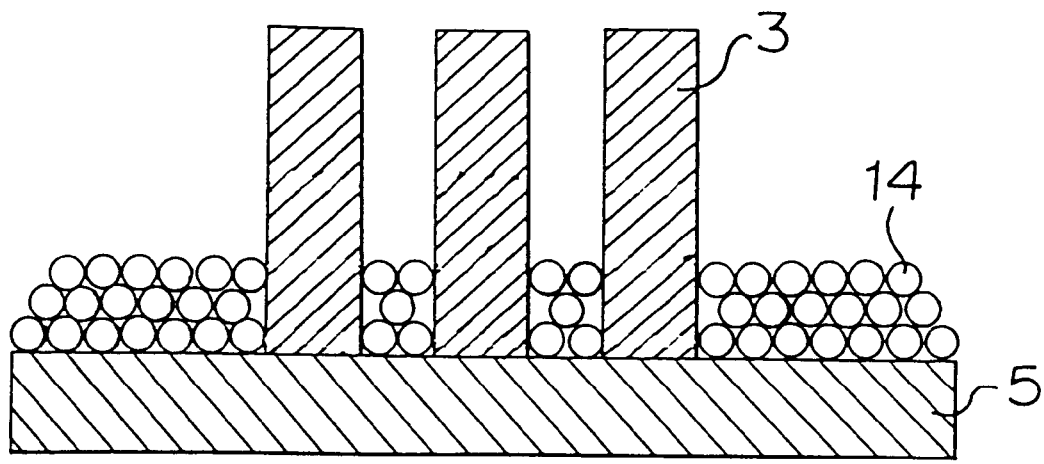
FIGS. 7a–7b are views illustrating a still further embodiment of the process for producing the assembly for measuring electrical properties of the present invention.
Figure 7:
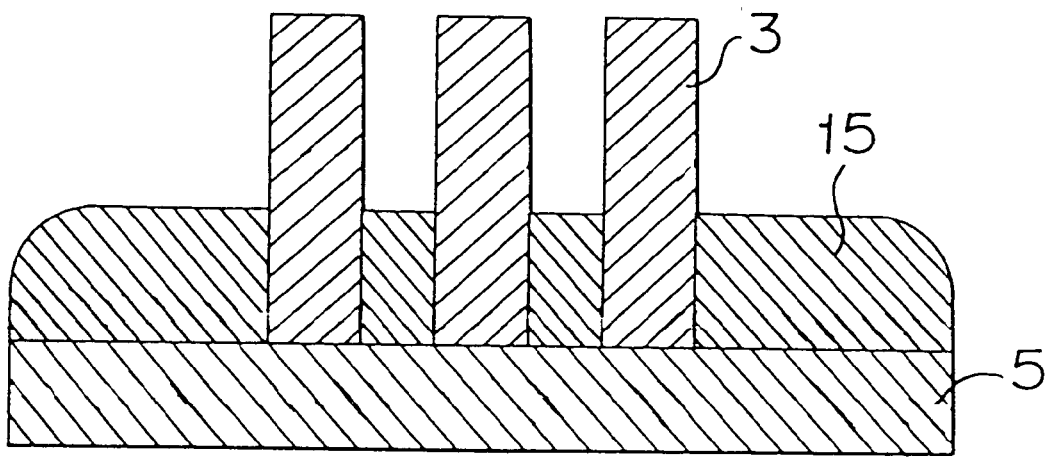

A process in which a low melting point glass is used as the insulating material, will be described with reference to FIG. 7.

At the base portions of electrically conductive rod-shaped single crystal products 3 on a substrate 5, for example, low melting point glass beads 14 are disposed, and they are heat-melted and cooled to obtain a low melting point embedding glass 15. Otherwise, it is possible to employ a method in which a low melting point glass in a frit form is filled in a predetermined thickness at the base portions of electrically conductive rod-shaped single crystal products on the substrate, and it is heat-melted in a heating furnace, followed by cooling to embed the base portions in the glass, or a method in which a solution having a low melting point glass powder dispersed in a solvent, is injected at the lower portions of electrically conductive rod-shaped single crystal products, and it is heat-melted in a heating furnace, followed by cooling to embed the lower portions in the glass.

At that time, there is no particular restriction as to e.g. the shape of the low melting point glass, and a low melting point glass of a frit form, a rod shape or a paste form may, for example, be employed. Among them, the glass of a frit form tends to adhere to the conductive rod-shaped products electrostatically, and the glass of a paste form is likely to creep up between the conductive rod-shaped products, and irregularities are likely to form at the time of removing the solvent. The glass of a bead form is most preferred, since it is free from electrostatic deposition to the conductive rod-shaped products, it is unnecessary to remove the solvent, and it is easy to obtain a uniform thickness. The average particle size of the bead-form low melting point glass is preferably from 20 to 200 μm.

As one embodiment of the present invention, the assembly for measuring electrical properties, which is composed of a semiconductor chip having lead-out wires, and the electrically conductive rod-shaped single crystal products, makes it easy to connect the electrically conductive rod-shaped single crystal products arranged in a narrow pitch, to external terminals, and it can readily be prepared by the LSI processing technique using the same substrate such as Si or GaAs as the substrate of the test sample. Especially when it is difficult to arrange lead-out wirings in a multi-type probe card for simultaneously measuring a plurality of test samples, in a state of a wafer, such a problem can readily be solved by arranging the wirings of the semiconductor chip in multiple layers.

Now, the present invention will be described in further detail with reference to Examples. However, it should be understood that the present invention is by no means restricted to such specific Examples.

EXAMPLE 1

Figure 8A:
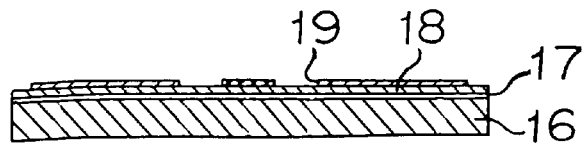
FIGS. 8a–8e are views illustrating another embodiment of the process for producing the assembly for measuring electrical properties of the present invention.
Figure 8B:
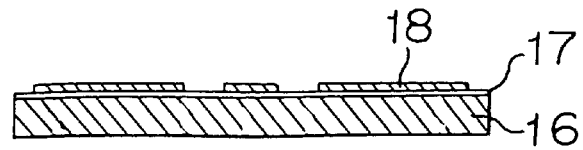
Figure 8C:
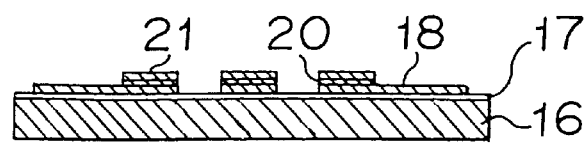
Figure 8D:
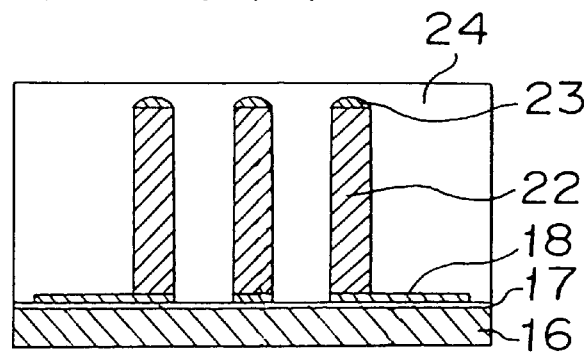
Figure 8E:
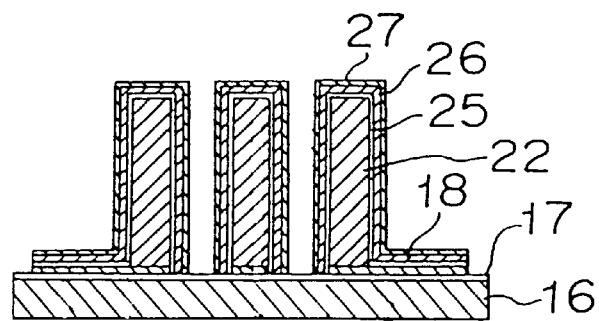

An Au vapor deposition film 19 having the same pattern as a circuit board was formed by photolithography in a thickness of 0.03 μm on a SOI substrate having single crystal silicon 18 formed on an oxide film (SiO$_2$) 17 of a single crystal silicon substrate 16 (FIG. 8(a)). Then, using a strong acid etching solution (a mixed solution of HF/HNO$_3$/CH$_3$COOH), Si at the exposed portions was removed by etching. Thereafter, the Au vapor deposition film 19 was removed by an etching solution (a mixed solution of KI/I/H$_2$O) (FIG. 8(b)). Then, at predetermined positions for growing rod-shaped single crystals, Au primer coating films 20 having the same shapes as the rod-shaped single crystals were formed by photolithography in a thickness of 0.03 μm, and Au pads 21 having the same shapes were formed thereon in a thickness of 2 μm by electroless plating (FIG. 8(c)). This assembly was heated in a reactor tube at 950° C., and a mixed gas of silicon tetrachloride and hydrogen, was supplied, to obtain rod-shaped single crystals 22. In this case, 300 pieces of an Au pad having a diameter of 30 μm were arranged with a pitch of 60 μm (only 3 pieces are illustrated in the Figure). VLS growth was continued for about 6 hours until the length of the rod-shaped single crystals 22 became 1.5 mm, whereupon the diameter of the forward end of each single crystal was 9 μm, and the length was just 1.5 mm. Then, polishing wax 24 was introduced until the rod-shaped single crystals 22 were embedded, and then solidified (FIG. 8(d)). The Si-Au alloy 23 side of the rod-shaped single crystals was polished in a wet system to remove the Si-Au alloy 23 and further flattened the surface of the forward ends of rod-shaped single crystals, and then the polishing wax 24 was removed by acetone. The length of the obtained rod-shaped single crystals was 1,000±2 $\mu$m; and the lengthwise precision was good. Further, the diameter of the forward ends was 10 $\mu$m. Then, only at the portions where Si was exposed, a Ni-P primer coating film 25 was selectively formed in a thickness of 0.5 $\mu$m by electroless plating, and on the surface of the Ni-P primer coating film, an Au film 26 was formed in a thickness of 2 $\mu$m, and the outermost Pd film 27 was formed in a thickness of 0.5 $\mu$m by electrolytic plating (FIG. 8(*e*)) to obtain electrically conductive rod-shaped single crystal products as identified as No. 2 in Table 1. Further, similar electrically conductive rod-shaped single crystal products (Nos. 7 and 9 in Table 1) were prepared by changing the diameter of Au pads, the pitch, the growing time and the film thicknesses of the electrically conductive films of Ni-P, Au and Pd. Further, without applying Pd plating as the outermost player, similar electrically conductive rod-shaped single crystal products (Nos. 3, 4, 5, 6, 8 and 10 in Table 1) were prepared by changing the diameter of the Au pads, the pitch, the growing time and the thickness of the electrically conductive film. Further, in No. 1 in Table 1, the conductive film was prepared solely by the vapor deposition film of Au.

No. 2 and No. 3 in Table 1 wherein the size of the electrically conductive rod-shaped single crystal products is the same, differ from each other only with respect to the presence or absence of the outermost Pd plating layer. Such electrically conductive rod-shaped single crystal products were connected to a circuit board to obtain an assembly for measuring electrical properties, which was subjected to durability test, whereby No. 2 having Pd plating applied as the outermost layer was found to be improved a few times over No. 3 in the durability. This durability test was conducted in such a manner that the electrically conductive rod-shaped single crystal products were contacted to Au vapor deposition films of a test sample with an overdrive of 10 $\mu$m, whereby the durability was evaluated by the number of contacting times when peeling of the plated film occurred at the forward ends of the electrically conductive rod-shaped single crystal products.

Further, other properties of the assembly for measuring electrical properties prepared as described above, were evaluated by the following methods, and the results are shown in Table 1.

Limiting overdrive

A load was exerted to the assembly for measuring electrical properties in this Example, and the pressing degree until a first probe pin broke, was measured, and the measured value was taken as the limiting overdrive. Here, this limiting overdrive was measured by means of a digital displacement meter (precision ±1 $\mu$m).

Positional precision

The positions of the forward ends of probe pins were measured by an optical microscope, and the positional displacement from the designed value was obtained.

Height precision

The heights of the forward ends of probe pins were measured by an optical microscope, whereupon the plane constituted by the forward ends of the pins, was obtained and the maximum departure from that plane was taken as the height precision.

Deformation of probe pins

By the above-mentioned measuring apparatus for the limiting overdrive of probe pins, buckling deformation was applied 10 times to apply each time an overdrive of 10 $\mu$m to probe pins, whereupon the presence or absence of deformation was inspected by a microscope.

Surface properties of probe pins

The presence or absence of defects in the plated film on the side surface of a probe pin was determined by means of a scanning electron microscope (SEM).

Short circuiting among probe pins

An alumina plate as an insulator was pressed against probe pins to apply an overdrive of 10 $\mu$m, and in that state, whether or not the insulating state was maintained among different probe pins, was evaluated by measuring the resistance by a commercially available multimeter. Here, when the resistance between probe pins was 1 M$\Omega$ or less, the pins were evaluated to have contacted to each other to establish electrical short circuiting.

Continuity test

Continuity of wiring between the forward end of a probe pin and a circuit board was determined by the resistance by means of a commercially available multimeter. When this resistance was at least 50 $\Omega$, it was evaluated that there was no continuity

TABLE 1

| Examples | No. | Shape of single crystal | | | Thickness t of conductive film $\mu$m | $d^{-2.4} \times L^{2.8}$ | t/d | Presence of alloy portion at the forward end | Inclination of pin | Thickness of insulating film on pin $\mu$m | Pitch of pins $\mu$m |
|---|---|---|---|---|---|---|---|---|---|---|---|
| | | Diameter d $\mu$m | Length $\mu$m | Aspect ratio | | | | | | | |
| | 1 | 1 | 500 | 500 | 0.1 | $3.6 \times 10^8$ | 0.1 | No | 0 | Nil | 60 |
| | 2 | 10 | 1000 | 100 | $\overline{3}$ | $1.0 \times 10^6$ | 0.3 | No | 0 | Nil | 60 |
| | 3 | 10 | 1000 | 100 | $\overline{3}$ | $1.0 \times 10^6$ | 0.3 | No | 0 | 0.1 | 60 |
| 1 | 4 | 10 | 3000 | 300 | 4 | $2.2 \times 10^7$ | 0.4 | No | 0 | Nil | 60 |
| | 5 | 50 | 2000 | 40 | 5 | $1.5 \times 10^6$ | 0.1 | No | 0 | 0.5 | 200 |
| 2 | 6 | 50 | 50 | 1 | 2 | 4.9 | 0.04 | No | 0 | Nil | 200 |
| | 7 | 50 | 2000 | 40 | 10 | $1.5 \times 10^5$ | 0.2 | Yes | 0 | Nil | 200 |
| | 8 | 100 | 3000 | 30 | $\overline{5}$ | $8.6 \times 10^4$ | 0.05 | Yes | 0 | 1.0 | 1000 |
| | 9 | 300 | 3000 | 10 | 9 | $6.2 \times 10^3$ | 0.02 | No | 0 | Nil | 1000 |
| | 10 | 600 | 4800 | 8 | $\overline{6}$ | $4.4 \times 10^3$ | 0.01 | No | 0 | Nil | 1000 |

TABLE 1-continued

| | | Evaluation items | | | | | | |
|---|---|---|---|---|---|---|---|---|
| Examples | No. | Limiting overdrive μm | Positional precision μm | Height precision μm | Deformation of pin μm | Surface property of pin | Short circuiting between pins | Continuity test |
| | 1 | 400 | ±30 | ±10 | 0 | Good | Nil | Good |
| | 2 | 125 | ±7 | ±5 | 8 | Good | Nil | Good |
| | 3 | 125 | ±5 | ±2 | 8 | Good | Nil | Good |
| 1 | 4 | 800 | ±10 | ±5 | 12 | Good | Nil | Good |
| | 5 | 21 | ±5 | ±2 | 0 | Good | Nil | Good |
| 2 | 6 | 1 | ±5 | ±2 | 0 | Good | Nil | Good |
| | 7 | 21 | ±7 | ±5 | 0 | Good | Nil | Good |
| | 8 | 13 | ±5 | ±2 | 0 | Good | Nil | Good |
| | 9 | 1 | ±5 | ±2 | 0 | Good | Nil | Good |
| | 10 | 1 | ±5 | ±2 | 0 | Good | Nil | Good |

Note:
The underline "_" in the column for the thickness of conductive film indicates that a Pd plating layer was formed as the outermost layer.

Comparative Example 1

In the same manner as in Example 1 electrically conductive rod-shaped single crystal products having an aspect ratio outside the range of from 1 to 500 or a thickness of the conductive film of more than 10 μm, as shown in Table 2, were prepared by changing the size of Au pads, the pitch, the crystal growing time and the thickness of the conductive film Here, the conductive film was prepared solely by vapor deposition of Au in No. 1 and No. 2, and in No. 3 and No. 4 Ni-P was first formed in a thickness of 0.5 μm by electroless plating then, gold was plated by electrolytic plating, and as the outermost plate, Pd plating was applied in a thickness of 0.5 μm by electrolytic plating. These electrically conductive rod-shaped single crystal products were bonded to circuit boards to obtain assemblies for measuring electrical properties, which were evaluated by the same methods as in Example 1. The results are shown in Table 2.

EXAMPLE 2

Figure 9A:
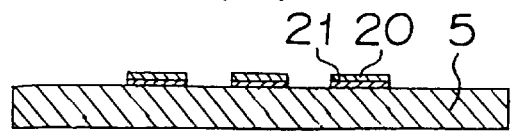
FIGS. 9a–9e are views illustrating a further embodiment of the process for producing the assembly for measuring electrical properties of the present invention.
Figure 9B:
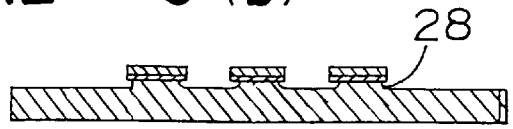
Figure 9C:
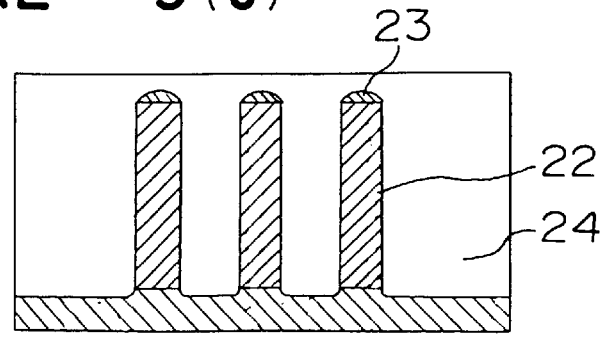
Figure 9D:
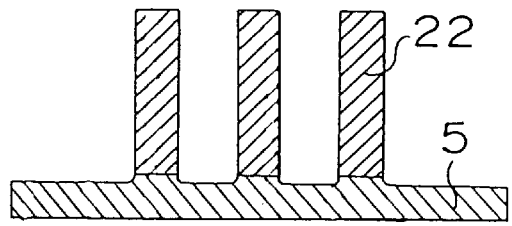
Figure 9E:
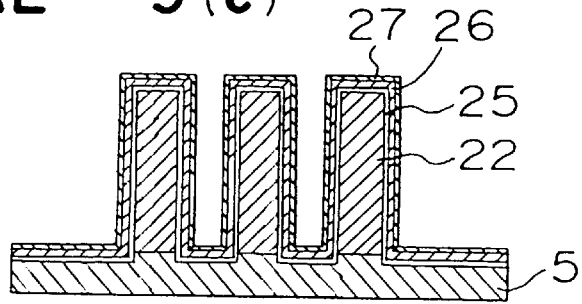

Au primer coating films 20 having the same shapes as rod-shaped single crystals were formed by photolithography in a thickness of 0.03 μm at predetermined positions for growing rod-shaped single crystals on a single crystal silicon substrate 5, and Au pads 21 having the same shapes were formed in a thickness of 2 μm by electroless plating (FIG. 9(a)). This silicon substrate 5 was subjected to etching with a mixed solution of $HF/HNO_3/CH_3COOH$ to form a mesa-shape 28, so that the Au pads 21 were placed thereon (FIG. 9(b)). The assembly was heated to 950° C. in a reactor tube, and a mixed gas of silicon tetrachloride and hydrogen, was supplied, to obtain rod-shaped single crystals 22. In this case, 300 pieces of an Au pad having a diameter of 35 μm were arranged with a pitch of 60 μm (only 3 pieces are illustrated in the Figure). Further, the length of the rod-shaped single crystals 22 grown by the VLS method was 2,500 μm, and the diameter of the forward ends thereof was

TABLE 2

| | | Shape of single crystal | | | Thickness t of conductive film μm | $d^{-2.4} \times L^{2.8}$ | t/d | Presence of alloy portion at the forward end | Inclination of pin | Thickness of insulating film on pin μm | Pitch of pins μm |
|---|---|---|---|---|---|---|---|---|---|---|---|
| Comparative Examples | No. | Diameter d μm | Length μm | Aspect ratio | | | | | | | |
| | 1 | 1 | 500 | 500 | 0.05 | $3.6 \times 10^7$ | 0.05 | No | 0 | Nil | 60 |
| | 2 | 2 | 1100 | 550 | 0.4 | $6.2 \times 10^7$ | 0.2 | No | 0 | Nil | 60 |
| 1 | 3 | 50 | 30 | 0.6 | 2 | 1.1 | 0.04 | No | 0 | Nil | 200 |
| | 4 | 50 | 2000 | 40 | 12 | $1.5 \times 10^5$ | 0.24 | No | 0 | Nil | 200 |

| | | Evaluation items | | | | | | |
|---|---|---|---|---|---|---|---|---|
| Examples | No. | Limiting overdrive μm | Positional precision μm | Height precision μm | Deformation of pin μm | Surface property of pin | Short circuiting between pins | Continuity test |
| | 1 | 400 | ±30 | ±10 | 12 | Poor | Nil | (*1) |
| | 2 | 800 | ±30 | ±10 | 30 | Good | Present | (*2) |
| 1 | 3 | 0 | ±5 | ±2 | 0 | Good | Nil | (*3) |
| | 4 | 21 | ±7 | ±5 | 0 | Good | Nil | (*4) |

Note:
*The underline "_" in the column for the thickness of conductive film indicates that a Pd plating layer was formed as the outermost layer.
(*1): A conductive film was not properly formed, and continuity was not established.
(*2): The positional precision of the forward ends of pins was very poor, and no proper measuring was possible.
(*3): The length of the rod-shaped single crystals was so short that no proper measuring was possible.
(*4): The conductive film was so thick that peeling of the conductive film resulted, and continuity was not established.

24 μm. Then, polishing wax 24 was introduced until the rod-shaped single crystals 22 were embedded, and then solidified (FIG. 9(c)). The Si-Au alloy 23 side of such rod-shaped single crystals, was wet-polished to remove the Si-Au alloy 23 and to further level the plane constituted by the rod-shaped single crystals. Then, the polishing wax 24 was removed by acetone (FIG. 9(d)). The length of the obtained rod-shaped single crystals was 2,000±2 μm, and the diameter of the forward ends thereof was 25 μm. Thereafter, a Ni-P primer coating film 25 of the rod-shaped single crystals was formed in a thickness of 0.5 μm by electroless plating, and on the surface of the Ni-P primer coating film 25, an Au film 26 was formed in a thickness of 4 μm by electrolytic plating. Furthers a Pd film 27 as the outermost layer was formed in a thickness of 0.5 μm by electrolytic plating (FIG. 9(e)). Then, on the substrate of electrically conductive rod-shaped single crystal products obtained as shown in FIG. 9, a dam plate 10 was disposed so that the base portions of the electrically conductive rod-shaped single crystal products 3 and their periphery were exposed, as shown in FIG. 4 (here, the rod-shaped single crystals and the conductive film are shown as electrically conductive rod-shaped single crystal products 3) (FIG. (a)). This dam plate was made of a semi-cured epoxy resin and bonded to the substrate by a non-cured epoxy resin. Then, a fixing material made of a non-cured epoxy resins was coated on the base portions of the electrically conductive rod-shaped single crystals 3 and the exposed portions between the base portions and the dam plate 10. Then, this epoxy resin was heated and cured to obtain a cured product 11 (FIG. 4(b)). In this cases the epoxy resin composition was prepared by blending 80 g of methyl tetrahydrophthalic anhydride, 2 g of 2,4,6-trisphenol and 100 g of kaolin clay powder to 100 g of a bisphenol A type epoxy resin. The semi-cured epoxy resin to be used as the dam plate was prepared by curing the abovementioned epoxy resin composition in an oven under conditions of 100° C. for 50 minutes, and the overall heat curing after coating the non-cured epoxy resin, was conducted under conditions of 100° C. for 5 hours. Here, the length of the electrically conductive rod-shaped single crystal products projected from the epoxy resin surface was 1,000 μm. Then, the silicon substrate 5 was removed by polishing by means of a wet polishing method (FIG. 4(c)). Here, the thickness of the epoxy resin was about 1,000 μm, and the ends of the electrically conductive rod-shaped single crystal products projecting from the epoxy resin surface was 50 μm, as measured by an optical microscope. The lower end surfaces of the electrically conductive rod-shaped single crystal products and the wirings 8 on a circuit board 9 were connected to obtain an assembly for measuring electrical properties as shown by No. 20 in Table 3 (FIG. 4(d)). In the same manner, electrically conductive rod-shaped single crystal products shown in Table 3 were prepared by changing the diameter of Au pads, the pitch, the crystal growing time, the thickness of the conductive film and the method for film forming. Such single crystal products were bonded to a circuit board to obtain an assembly for measuring electrical properties.

The results of evaluation of the assembly for measuring electrical properties thus prepared, are shown in Table 3.

TABLE 3

| Examples | No. | Shape of single crystal | | | Thickness of embedding insulating material μm | Projecting Length L of pin μm | Thickness t of conductive film μm | $d^{-2.4} \times L^{2.8}$ | t/d | Presence of alloy portion at at the forward end | Inclination of pin |
|---|---|---|---|---|---|---|---|---|---|---|---|
| | | Diameter d μm | Length μm | Aspect ratio | | | | | | | |
| | 10 | 2 | 140 | 70 | 40 | 100 | 0.1 | $7.5 \times 10^4$ | 0.05 | No | 0 |
| | 11 | 1.5 | 130 | 87 | 50 | 80 | 0.1 | $8 \times 10^4$ | 0.1 | No | 0 |
| | 12 | 5 | 2500 | 500 | 2000 | 500 | 0.5 | $7.6 \times 10^5$ | 0.1 | No | 0 |
| | 13 | 25 | 2000 | 80 | 1000 | 1000 | 10 | $1.1 \times 10^5$ | 0.4 | No | 0 |
| | 14 | 42 | 5000 | 119 | 2000 | 3000 | $\underline{10}$ | $6.9 \times 10^5$ | 0.24 | No | 0 |
| 2 | 15 | 42 | 5200 | 124 | 2200 | 3000 | $\underline{10}$ | $6.9 \times 10^5$ | 0.24 | No | 0 |
| | 16 | 10 | 1000 | 100 | 500 | 500 | $\underline{0.5}$ | $1.4 \times 10^5$ | 0.05 | No | 2 |
| 3 | 17 | 10 | 1000 | 100 | 500 | 500 | 0.5 | $1.4 \times 10^5$ | 0.05 | No | 6 |
| | 18 | 10 | 1000 | 100 | 500 | 500 | 0.5 | $1.4 \times 10^5$ | 0.05 | No | 10 |
| | 19 | 10 | 1000 | 100 | 500 | 500 | 0.5 | $1.4 \times 10^5$ | 0.05 | No | 11 |
| | 20 | 25 | 2000 | 80 | 1000 | 1000 | 5 | $1.1 \times 10^5$ | 0.2 | No | 0 |
| | 21 | 10 | 1000 | 100 | 500 | 500 | $\underline{0.5}$ | $1.4 \times 10^5$ | 0.05 | No | 0 |
| | 22 | 10 | 1000 | 100 | 500 | 500 | 0.5 | $1.4 \times 10^5$ | 0.05 | No | 0 |
| | 23 | 30 | 3000 | 100 | 1000 | 2000 | 3 | $5.0 \times 10^5$ | 0.1 | No | 0 |
| | 24 | 100 | 4000 | 30 | 1500 | 2500 | $\underline{5}$ | $5.0 \times 10^4$ | 0.05 | No | 0 |
| | 25 | 200 | 4800 | 24 | 2000 | 2800 | $\underline{10}$ | $4.2 \times 10^3$ | 0.05 | No | 0 |
| | 26 | 600 | 5000 | 100 | 2000 | 3000 | $\underline{6}$ | $1.2 \times 10^3$ | 0.02 | No | 0 |

| Examples | No. | Thickness of insulating film on pin μm | Pitch of pins μm | Evaluation items | | | | | | |
|---|---|---|---|---|---|---|---|---|---|---|
| | | | | Limiting overdrive μm | Positional precision μm | Height precision μm | Deformation of pin μm | Surface property of pin | Short circuiting between pins | Continuity test |
| | 10 | 1.0 | 60 | 12 | ±5 | ±2 | 0 | Good | Nil | Good |
| | 11 | Nil | 60 | 11 | ±5 | ±2 | 0 | Good | Nil | Good |
| | 12 | Nil | 60 | 93 | ±5 | ±2 | 0 | Good | Nil | Good |
| | 13 | Nil | 60 | 16 | ±5 | ±2 | 12 | Good | Nil | Good |
| | 14 | Nil | 200 | 93 | ±5 | ±2 | 0 | Good | Nil | Good |
| 2 | 15 | 1.0 | 200 | 93 | ±16 | ±12 | 0 | Good | Nil | Good |
| | 16 | Nil | 60 | 20 | ±5 | ±2 | 0 | Good | Nil | Good |
| 3 | 17 | Nil | 60 | 20 | ±8 | ±4 | 0 | Good | Nil | Good |
| | 18 | Nil | 60 | 20 | ±16 | ±9 | 0 | Good | Nil | Good |

TABLE 3-continued

| 19 | Nil  | 60   | 20 | ±31 | ±11 | 6  | Good | Nil | Good |
| 20 | Nil  | 60   | 16 | ±5  | ±2  | 0  | Good | Nil | Good |
| 21 | 0.1  | 60   | 20 | ±5  | ±2  | 0  | Good | Nil | Good |
| 22 | 12.0 | 60   | 20 | ±5  | ±2  | 30 | Good | Nil | Good |
| 23 | 5.0  | 60   | 67 | ±5  | ±2  | 0  | Good | Nil | Good |
| 24 | 5.0  | 1000 | 10 | ±5  | ±2  | 0  | Good | Nil | Good |
| 25 | 5.0  | 1000 | 1  | ±5  | ±2  | 0  | Good | Nil | Good |
| 26 | 5.0  | 1000 | 1  | ±5  | ±2  | 0  | Good | Nil | Good |

Note:
The assembly was prepared by a resin embedding method, and the underline "_" in the column for the thickness of conductive film indicates that a Pd plating layer was formed as the outermost layer. The lower projecting length of the probe pin was 1 μm in Nos. 10 and 11, 10 μm in Nos. 12 to 17, 50 μm in Nos. 18 to 22 and 100 μm in No. 23 to 26.

EXAMPLE 3

Figure 10A:
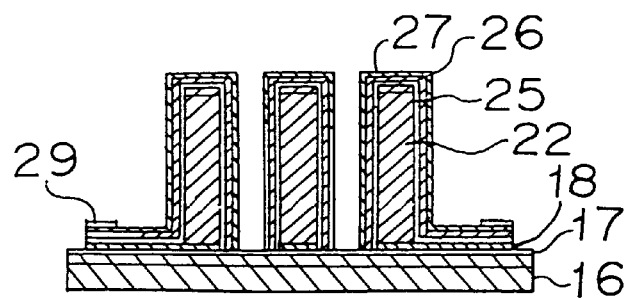
FIGS. 10a–10d are views illustrating a still further embodiment of the process for producing the assembly for measuring electrical properties of the present invention.
Figure 10B:
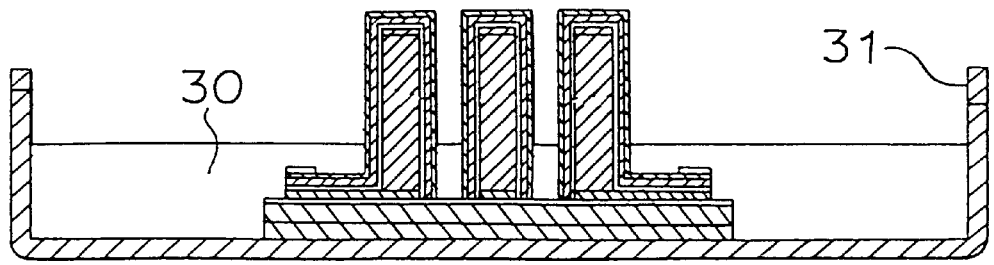
Figure 10C:
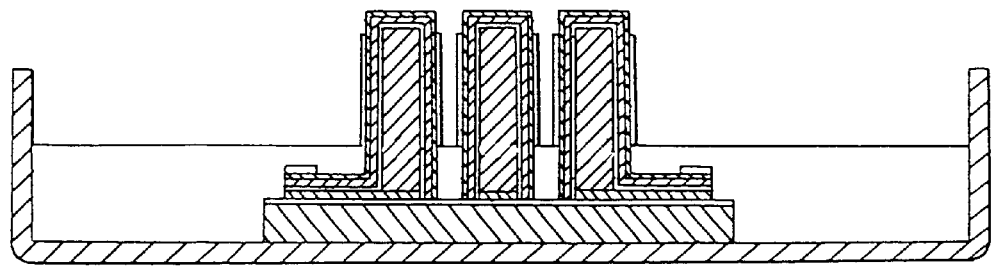
Figure 10D:
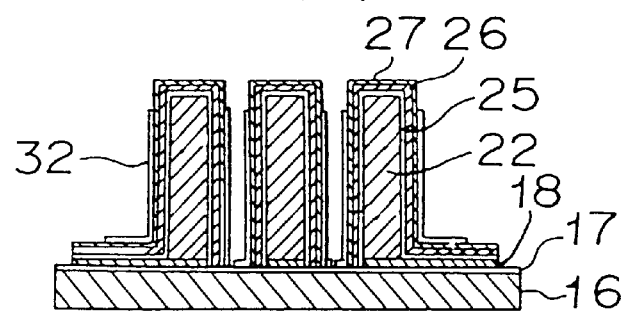

As shown in FIG. 10, masking tapes 29 were put on the connecting portions with lead-out wires of electrically conductive rod-shaped single crystal products obtained in Example 1 (No. 2 in Table 1) (FIG. 10(a)), and the assembly was left in a Petri dish 31 containing a solution 30 of polyamic acid as a precursor of polyimide so that the forward ends of the electrically conductive rod-shaped single crystal products were located above, and ⅓ of the length of the electrically conductive rod-shaped single crystal products were dipped (FIG. 10(b)), whereby the solution creeped up towards the forward ends of the pins by the surface tension (FIG. 10(c)). When the solution creeped up to a level of about 100 μm from the forward ends, the assembly was taken out from the solutions and the masking tapes 29 were peeled off, followed by curing under heating (250° C. for 30 minutes) (FIG. 10(d)). In this manners an insulating film 32 of polyimide was formed in a thickness of 0.1 μm on the surface of the electrically conductive rod-shaped single crystal products. Thus, by this methods the electrically conductive rod-shaped single crystal products shown by No. 3 in Table 1 were prepared. Further, in the same manners electrically conductive rod-shaped single crystal products shown by Nos. 5 and 8 in Table 1 were prepared by changing the concentration of polyamic acid.

This method can be applied also to Example 2. In the case of Example 2, the insulating film is formed on the obtained electrically conductive rod-shaped single crystal products by means of the above-mentioned method prior to disposing the dam plate. In this case, no masking tape is required, since no wiring is provided. Thereafter, the dam plate was disposed in the same manner as in Example 2, and the subsequent process was carried out in the same manner to obtain electrically conductive rod-shaped single crystal products insulated except for the forward end portions (Nos. 10, 15 and 21 to 26 in Table 3).

The electrically conductive rod-shaped single crystal products thus obtained were bonded to circuit boards to obtain assemblies for measuring electrical properties, which were evaluated by the same methods as in Example 1. The results are shown in Tables 1 and 3.

EXAMPLE 4

Figure 5:
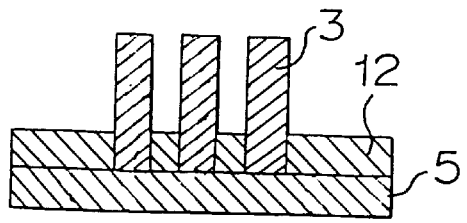
FIG. 5a–5d are views illustrating another embodiment of the process for producing the assembly for measuring electrical properties of the present invention.
Figure 5:
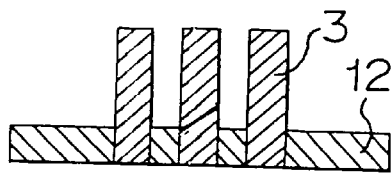
Figure 5:
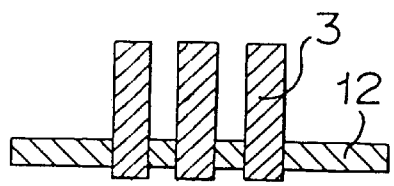
Figure 5:
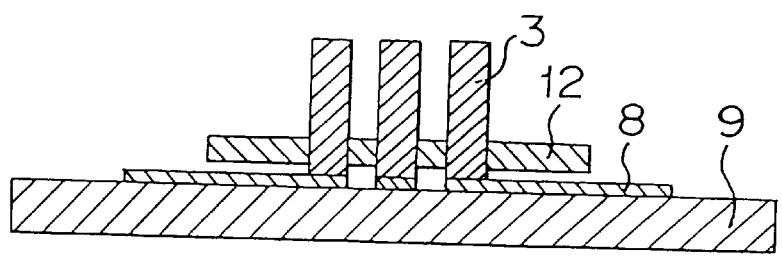

As shown in FIG. 5, an epoxy resin composition was coated on the surface of a substrate of electrically conductive rod-shaped single crystals obtained in the same manner as in Example 2, so that the upper portions of the electrically conductive rod-shaped single crystal products 3 projected with a length of 1,000 μm, and heated and cured (FIG. 5(a)). In this case, the epoxy resin composition was the same as used in Example 2, and the heating and curing were conducted under the same conditions. Thereafter, the silicon substrate 5 was removed by polishing by means of a wet system polishing method (FIG. 5(b)). The lower portion of the cured product 12 of the epoxy resin embedding the electrically conductive rod-shaped single crystal products, was treated with an aqueous alkaline solution of NaOH to let the electrically conductive rod-shaped single crystal products project (FIG. 10(c)). With respect to the obtained structures the polished surface was examined by an optical microscopes whereby the lower portions of the electrically conductive rod-shaped single crystal products were found to project 10 μm from the resin surface. The lower end surfaces of the electrically conductive rod-shaped single crystal products and the wirings 8 of the same circuit board 9 as used in Example 2 were connected to obtain electrically conductive rod-shaped single crystal products shown by No. 28 in Table 4 (FIG. 5(d)). Further, in the same manners electrically conductive rod-shaped single crystal products identified by Nos. 29 and 30 in Table 4 were prepared by changing the treating time with the aqueous alkaline solution.

The electrically conductive rod-shaped single crystal products thus obtained were bonded to circuit boards to obtain assemblies for measuring electrical properties, which were then evaluated. The evaluation results are shown in Table 4.

TABLE 4

| Examples | No. | Shape of single crystal | | | Projecting length | Lower projecting | Thickness t of | | | Presence of alloy portion | Inclination of pin |
|---|---|---|---|---|---|---|---|---|---|---|---|
| | | Diameter d μm | Length μm | Aspect ratio | L of pin μm | length of pin μm | conductive film μm | $d^{-2.4} \times L^{2.8}$ | t/d | at the forward end | |
| | 28 | 25 | 2000 | 80 | 1000 | 10 | 3 | $1.1 \times 10^5$ | 0.12 | No | 0 |
| 4 | 29 | 25 | 2000 | 80 | 1000 | 50 | $\underline{3}$ | $1.1 \times 10^5$ | 0.12 | No | 0 |
| | 30 | 25 | 2000 | 80 | 1000 | 100 | $\underline{3}$ | $1.1 \times 10^5$ | 0.12 | No | 0 |
| 5 | 32 | 25 | 2000 | 80 | 1000 | 50 | $\underline{3}$ | $1.1 \times 10^5$ | 0.12 | No | 0 |

TABLE 4-continued

|  |  | Thickness of insulating film on pin μm | Pitch of pins μm | Evaluation items | | | | | | |
|---|---|---|---|---|---|---|---|---|---|---|
| Examples | No. | | | Limiting overdrive μm | Positional precision μm | Height precision μm | Deformation of pin μm | Surface property of pin | Short circuiting between pins | Continuity test |
|  | 28 | Nil | 60 | 16 | ±5 | ±2 | 0 | Good | Nil | Good |
| 4 | 29 | Nil | 60 | 16 | ±5 | ±2 | 0 | Good | Nil | Good |
|  | 30 | Nil | 60 | 16 | ±5 | ±2 | 0 | Good | Nil | Good |
| 5 | 32 | Nil | 60 | 16 | ±5 | ±2 | 0 | Good | Nil | Good |

Note:
The assembly was prepared by a resin embedding method, and the underline "_" in the column for the thickness of conductive film indicates that a Pd plating layer was formed as the outermost layer.

EXAMPLE 5

Firstly, polystyrene beads were coated on a substrate 5 of electrically conductive rod-shaped single crystal products 3 obtained in the same manner as in Example 2, and the beads were heated (200° C.) to form a uniform epoxy resin film 13 on the substrate (FIG. (a)). In this case, the beads were prepared by classifying polystyrene beads prepared by suspension polymerization to obtain beads having a diameter of 100 μm, and the obtained epoxy resin film had a thickness of 50 μm. On this film, an epoxy resin composition was coated so that the forward ends of the electrically conductive rod-shaped single crystal products projected 1,000 μm, and the epoxy resin composition was heated and cured under the same conditions as in Example 2 to form a cured product 12 of the epoxy resin (FIG. 6(b)). Then, the silicon substrate 5 was removed by wet polishing (FIG. 6(c)). Furthers the epoxy resin film 13 was dissolved and removed by immersion in toluene (FIG. 6(d)). Here, the lower portions of the electrically conductive rod-shaped single crystal products were found to project 50 μm from the resin surfaces as a result of inspection by an optical microscope. The products were bonded to a circuit board in the same manner as in Example 2 to obtain an assembly for measuring electrical properties identified by No. 32 in Table 4.

The evaluation results of the assembly for measuring electrical properties thus obtained, are shown in Table 4.

EXAMPLE 6

Firstly, low melting point glass beads 14 were filled on a substrate 5 of electrically conductive rod-shaped single crystal products 3 obtained in the same manner as in Example 2 (FIG. 7(a)). This assembly was put in a heating furnace, heated, melted and cooled to embed the electrically conductive rod-shaped single crystal products 3 with low melting ponit glass 15 (FIG. 7(b)). In this case, the glass beads had an average particle size of 100 μm, a softening point of 390° C. and a thermal expansion coefficient of $4.2 \times 10^9$ (1/°C.) at from 30 to 250° C. The thickness of the embedding portion of low melting point glass thus obtained was 1,000 μm, and the forward ends of the electrically conductive rod-shaped single crystal products were found to project 1,000 μm from the embedding portion. Thereafter, the silicon substrate 5 was removed by wet-polishing in the same manner as in Example 2, followed by bonding with a circuit board to obtain an assembly for measuring electrical properties identified by No. 33 in Table 5. Further, in the same manner, other electrically conductive rod-shaped single crystal products in Table 5 were prepared by changing the amount of low melting point glass beads filled to the rod-shaped single crystal products of different construction and shape. These products were bonded to circuit boards to obtain assemblies for measuring electrical properties. The evaluation results of the assemblies for measuring electrical properties thus obtained are shown in Table 5.

TABLE 5

| Examples | No. | Shape of single crystal | | | Thickness of embedding insulating material μm | Projecting Length L of pin μm | Thickness t of conductive film μm | $d^{-2.4} \times L^{2.8}$ | t/d | Presence of alloy portion at the forward end | Inclination of pin |
|---|---|---|---|---|---|---|---|---|---|---|---|
|  |  | Diameter d μm | Length μm | Aspect ratio | | | | | | | |
|  | 33 | 25 | 2000 | 80 | 1000 | 1000 | 5 | $1.1 \times 10^5$ | 0.2 | No | 0 |
|  | 34 | 10 | 1000 | 100 | 500 | 500 | $\overline{0.5}$ | $1.4 \times 10^5$ | 0.05 | No | 0 |
| 6 | 35 | 30 | 3000 | 100 | 1000 | 2000 | 3 | $5.0 \times 10^5$ | 0.1 | No | 0 |
|  | 36 | 100 | 4000 | 30 | 1500 | 2500 | $\overline{5}$ | $5.0 \times 10^4$ | 0.05 | No | 0 |
|  | 37 | 200 | 4800 | 24 | 2000 | 2800 | $\overline{10}$ | $4.2 \times 10^3$ | 0.05 | No | 0 |
|  | 38 | 600 | 5000 | 100 | 2000 | 3000 | $\overline{6}$ | $1.2 \times 10^3$ | 0.02 | No | 0 |

| Examples | No. | Presence of insulating film on pin μm | Pitch of pins μm | Evaluation items | | | | | | |
|---|---|---|---|---|---|---|---|---|---|---|
|  |  |  |  | Limiting overdrive μm | Positional precision μm | Height precision μm | Deformation of pin μm | Surface property of pin | Short circuiting between pins | Continuity test |
|  | 33 | 1.0 | 60 | 16 | ±5 | ±2 | 0 | Good | Nil | Good |
|  | 34 | 0.1 | 60 | 20 | ±5 | ±2 | 0 | Good | Nil | Good |
| 6 | 35 | 0.5 | 60 | 67 | ±5 | ±2 | 0 | Good | Nil | Good |
|  | 36 | 0.5 | 1000 | 10 | ±5 | ±2 | 0 | Good | Nil | Good |

TABLE 5-continued

| 37 | 0.5 | 1000 | 1 | ±5 | ±2 | 0 | Good | Nil | Good (*5) |
| 38 | 0.5 | 1000 | 1 | ±5 | ±2 | 0 | Good | Nil | Good (*5) |

Note:
The assembly was prepared by a resin embedding method, and the underline "_" in the column for the thickness of conductive film indicates that a Pd plating layer was formed as the outermost layer.
(*5): An assembly having a good result in the continuity test can be obtained, but the probability of obtaining such a good assembly is low as compared with other cases.

EXAMPLE 7

Figure 11A:
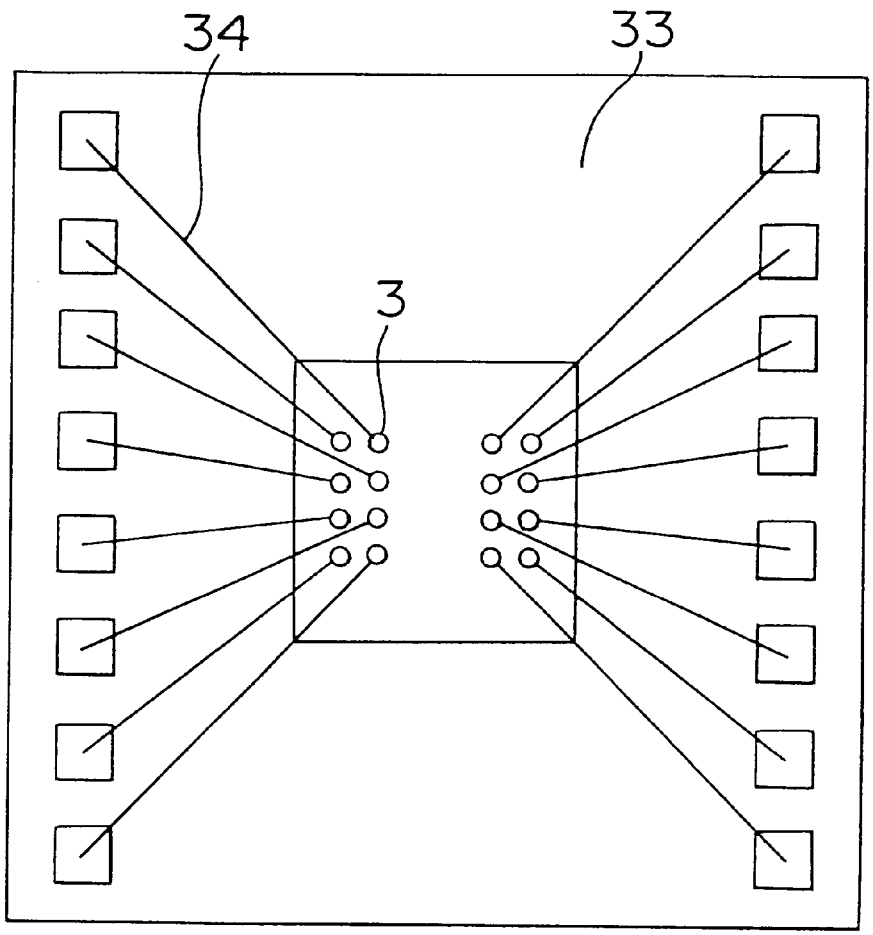
FIGS. 11a–11b are views illustrating an embodiment of the assembly for measuring electrical properties of the present invention.
Figure 11B:
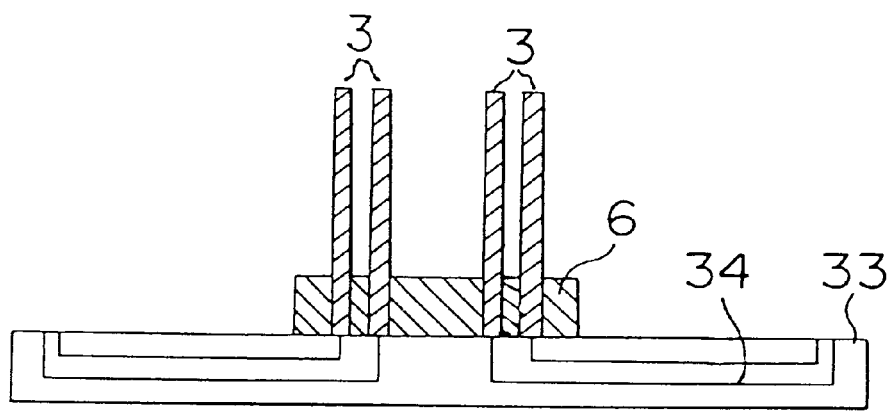

An embodiment of an assembly for measuring electrical properties comprising electrically conductive rod-shaped single crystal products and a semiconductor chip having lead-out wires will now be described with reference to FIG. 11. FIG. 11(a) is a diagrammatical view of the assembly for measuring electrical properties obtained by this Example, and FIG. 11(b) is its cross-sectional view. The electrically conductive rod-shaped single crystal products 3 were prepared in the same manner as in Example 2, and then formed into a structure embedded with low melting point glass 16 in the same manner as in Example 6. Here, the pitch of the electrically conductive rod-shaped single crystal products was 50 μm, and a total of 600 pieces were formed in a square of 5×5 mm (only 16 pieces are illustrated in FIG. 11) The semiconductor chip 33 for lead-out was prepared on a silicon substrate by a LSI production techniques and the wirings 34 were prepared in a double layer structure. This semiconductor chip had a size of 45×45 mm, and the width of the wiring was 25 μm for the one connected with the electrically conductive rod-shaped single crystal products, and the width of the lead-out side was 127 μm. The electrically conductive rod-shaped single crystal products thus prepared and the above-mentioned semiconductor chip having lead-out wires were bonded to obtain an assembly for measuring electrical properties. By using such a semiconductor chip, connection of the conductive rod-shaped single crystal products with outer wirings was facilitated and it was possible to obtain a highly reliable assembly for measuring electrical properties having probe pins of high density.

As described in the foregoing, according to the present invention, it is possible to present electrically conductive rod-shaped single crystal products which are not easily broken, which can be contacted with a test sample with a high positional precision and which can establish adequate continuity with the test sample and to provide such electrically conductive rod-shaped single crystal products formed in a high density at desired positions with high precision as well as an assembly for measuring electrical properties employing such electrically conductive rod-shaped single crystal products and a process for producing them efficiently. Further, the electrically conductive rod-shaped single crystal products of the present invention are not limited to the above Examples and can be effectively used not only for probe cards but also for fine vacuum devices or electron guns, or as probes for a scanning type probe microscope such as scanning tunnel microscope or inter-atomic force microscope.

What is claimed is:

1. An electrically conductive crystal product having a base portion and a surface, the surface including a bottom end surface and a forward end surface, comprising:
   a rod-shaped single crystal having a substantially cylindrical shape and having a substantially constant diameter formed by a vapor-liquid solid method;
   said crystal having a side surface and an aspect ratio of from 1 to 500; and
   at least the side surface of said crystal coated by an electrically conductive film having a surface and having a thickness of from 0.1 to 10 μm.

2. The electrically conductive crystal product according to claim 1, wherein the diameter of said rod-shaped single crystal is from 1 to 600 μm.

3. The electrically conductive crystal product according to claim 1, wherein at least the surface of the electrically conductive film is Pd.

4. The electrically conductive crystal product according to claim 1, wherein the diameter d of the rod-shaped single crystal is from 1 to 50 μm, and the thickness of the electrically conductive film is at most d×0.4 μm.

5. The electrically conductive crystal product according to claim 1, having its surface, except for at least its forward end surface, coated by an insulating film having a thickness of from 0.1 to 10 μm.

6. The electrically conductive crystal product according to claim 1, wherein said crystal product is integral with a substrate having a surface on which the rod-shaped single crystal is formed, and the forward end surface of said crystal product projects with a length of from 10 to 3,000 μm from the surface of the substrate.

7. The electrically conductive crystal product according to claim 1, wherein the base portion of said crystal product is embedded at a desired position in an insulating material having a surface and an embedding thickness, and the forward end surface of said crystal product projects with a length of from 10 to 3,000 μm from the surface of the insulating material.

8. The electrically conductive crystal product according to claim 6, wherein the limiting overdrive of said crystal product is at most 1,000 μm.

9. The electrically conductive crystal product according to claim 7, wherein the limiting overdrive of said crystal product is at most 1,000 μm.

10. The electrically conductive crystal product according to claim 6, wherein said crystal product is fixed at an angle from of from 80° to 90° to the substrate surface.

11. The electrically conductive crystal product according to claim 7, wherein said crystal product is fixed at an angle from of from 80° to 90° to the surface of the insulating material.

12. The electrically conductive crystal product according to claim 6, wherein the distance L (μm) between the forward end surface of said crystal product and the substrate surface on which the electrically conductive rod-shaped single crystal is fixed, and the diameter d (μm) of the electrically conductive rod-shaped single crystal are within a range of $d^{-2.4} \cdot L^{2.8} \geq 5.0 \times 10^4$.

13. The electrically conductive crystal product according to claim 7, wherein the distance L (μm) between the forward end surface of said crystal product and the surface of the insulating material in which said crystal product is embedded, and the diameter d (μm) of the electrically conductive rod-shaped single crystal are within a range of $d^{-2.4} \cdot L^{2.8} \geq 5.0 \times 10^4$.

14. The electrically conductive crystal product according to claim 7, wherein the embedding thickness of the insulating material is from 0.1 to 2,000 μm.

15. The electrically conductive crystal product according to claim 7, wherein the insulating material is an epoxy resin.

16. The electrically conductive crystal product according to claim 7, wherein the insulating material is low melting point glass having a thermal expansion coefficient (1/°C.) of from $3.0 \times 10^{-6}$ to $8.0 \times 10^{-6}$ at from 30 to 250° C.

17. An assembly for measuring electrical properties, comprising an electrically conductive crystal product of claim 7 and a circuit board having wiring, wherein the base portion of said crystal product embedded in the insulating material is connected to a wiring of the circuit board.

18. An assembly for measuring electrical properties comprising:

an electrically conductive crystal product comprising:
 a rod-shaped single crystal having a substantially cylindrical shape and having
 a substantially constant diameter formed by a vapor-liquid solid method;
 said crystal having a side surface and an aspect ratio of from 1 to 500;
 at least the side surface of said crystal coated by an electrically conductive film
 having a surface and having a thickness of from 0.1 to 10 μm; and
a semiconductor chip bonded to said crystal product.

* * * * *